(12) United States Patent
Yasui et al.

(10) Patent No.: US 7,955,647 B2
(45) Date of Patent: Jun. 7, 2011

(54) METHOD FOR MANUFACTURING FILM OR PIEZOELECTRIC FILM

(75) Inventors: Motohiro Yasui, Nagoya (JP); Jun Akedo, Tsukuba (JP); Sou Baba, Tsukuba (JP)

(73) Assignees: Brother Kogyo Kabushiki Kaisha, Nagoya (JP); National Institute of Advanced Industrial Science and Technology, Tokyo (JP)

(*) Notice: Subject to any disclaimer, the term of this patent is extended or adjusted under 35 U.S.C. 154(b) by 1909 days.

(21) Appl. No.: 11/090,173

(22) Filed: Mar. 28, 2005

(65) Prior Publication Data

US 2005/0220987 A1  Oct. 6, 2005

(30) Foreign Application Priority Data

Mar. 30, 2004  (JP) .................................. 2004-100282

(51) Int. Cl.
  *C23C 16/00* (2006.01)
  *B05D 5/12* (2006.01)
(52) U.S. Cl. ........................ 427/248.1; 427/58; 427/100
(58) Field of Classification Search ............... 427/248.1, 427/58, 100
  See application file for complete search history.

(56) References Cited

U.S. PATENT DOCUMENTS

| | | | |
|---|---|---|---|
| 4,666,486 A | 5/1987 | Hutta | |
| 5,928,719 A | 7/1999 | Mishima et al. | |
| 6,482,758 B1 | 11/2002 | Weber et al. | |
| 7,153,567 B1 | 12/2006 | Akedo et al. | |
| 2001/0007808 A1 | 7/2001 | Mishima et al. | |
| 2004/0026030 A1 | 2/2004 | Hatono et al. | |
| 2006/0087000 A1 | 4/2006 | Okuno | |
| 2006/0201419 A1 | 9/2006 | Akedo et al. | |
| 2006/0222862 A1 | 10/2006 | Akedo et al. | |
| 2006/0273319 A1 | 12/2006 | Dairiki et al. | |
| 2008/0241556 A1 | 10/2008 | Akedo et al. | |

FOREIGN PATENT DOCUMENTS

| | | |
|---|---|---|
| EP | 0 441 300 A2 | 8/1991 |
| EP | 441300 A2 * | 8/1991 |
| EP | 0 555 828 A1 | 8/1993 |
| EP | 1 231 294 A1 | 8/2002 |
| EP | 1231294 A1 * | 8/2002 |
| EP | 1 510 598 A1 | 3/2005 |
| EP | 1 970 975 A1 | 9/2008 |

(Continued)

OTHER PUBLICATIONS

J. Akedo et al., "Synthesis of Functional Ceramics Layers Using Novel Method Based on Impact of Ultra-Fine Particles", AIP Conference Proceedings AIP USA, No. 620, (2002) pp. 1101-1104.

(Continued)

*Primary Examiner* — Timothy H Meeks
*Assistant Examiner* — Kellym Gambetta
(74) *Attorney, Agent, or Firm* — Oliff & Berridge, PLC

(57) ABSTRACT

A simple method is provided for manufacturing a film such as a piezoelectric film wherein the adhesiveness of the film on a substrate can be improved. An aerosol containing particles is ejected onto a substrate so that the particles adhere thereto, wherein the ratio between the Vickers hardness Hv(b) of the adhesion surface to which the particles are attached in the substrate, and the Vickers hardness Hv(p) of the particles is within a range of $0.39 \leq Hv(p)/Hv(b) \leq 3.08$. The adhesiveness between the particles and the substrate can thereby be improved to reliably form a film. The present invention can be satisfactorily applied to the formation of a piezoelectric film.

10 Claims, 1 Drawing Sheet

FOREIGN PATENT DOCUMENTS

| | | |
|---|---|---|
| JP | A 3-231096 | 10/1991 |
| JP | A 11-330577 | 11/1999 |
| JP | A 2002-309383 | 10/2002 |
| JP | A 2003-183848 | 7/2003 |
| JP | A 2003-213451 | 7/2003 |
| JP | A 2004-91854 | 3/2004 |
| WO | WO 01/27348 A1 | 4/2001 |
| WO | WO 03/100131 A1 | 12/2003 |

OTHER PUBLICATIONS

European Office Action in European Patent Application No. 05 006 660.4, dated Oct. 25, 2010.

Jun Akedo et al, "Aerosol Deposition Method (ADM) for Nano-Crystal Ceramics Coating Without Firing," Multiscale Phenomena in Materials—Experiments and Modeling Related to Mechanical Behavior. Symposium, Mater. Res. Soc. Symposium Proceedings, vol. 779, p. 287-292 (2003).

Notice of Reasons for Rejection issued in Japanese Patent Application No. 2005-098899; mailed Apr. 1, 2010; with English-language translation.

Nakada et al., "Electro-Optical Properties of (Pb, La)(Zr, Ti)$O_3$ Films Prepared by Aerosol Deposition Method;" Jpn. J. Appl. Phys. vol. 42 (2003); pp. 5960-5962.

Garg et al., "Effect of rare earth (Er, Gd, Eu, Nd and La) and bismuth additives on the mechanical and piezoelectric properties of lead zirconate titanate ceramics;" Materials Science and Engineering B86 (2001); pp. 134-143.

A R James et al.; "Structural, thermal, electromechanical and mechanical property study on $(Pb_{0.93}La_{0.07})(Zr_{0.60}Ti_{0.40})O_3$ ceramics Synthesized by a high energy mechanochemical milling process;" Smart Mater. Struct. 17 (2008).

A R James et al.; "The effect of high energy mechanochemical processing on the microstructure, piezoelectric, ferroelectric and mechanical properties of PLZT ceramics;" Nanotechnology 19 (2008).

Decision of Technical Board of Appeal 3.5.2 dated Oct. 4, 2004; T 1110/03-3.5.2 T031110e.p1w 043090008.

Decision of Jan. 28, 1997 issued in European Patent Application No. 91109165.0; T 0823/96-3.3.1.

Vickers hardness test; Wickipedia; downloaded Dec. 15, 2009.

Office Action issued in European Patent Application No. 05 006 660.4; Dec. 22, 2009.

* cited by examiner

METHOD FOR MANUFACTURING FILM OR PIEZOELECTRIC FILM

BACKGROUND OF THE INVENTION

1. Field of the Invention

The present invention relates to a method for manufacturing a film such as a piezoelectric film.

2. Description of the Related Art

Aerosol deposition (AD) is known as a method for forming a film on a substrate using particles of piezoelectric material or the like, and can be used in the manufacture of piezoelectric actuators and the like used in the print heads of inkjet printers, for example. This involves ejecting microparticles dispersed in a gas (aerosol) toward a substrate surface, and forming a piezoelectric film by causing the microparticles to collide with, and deposit on, the substrate (for example, see Japanese Laid-Open Patent Application No. 11-330577).

SUMMARY OF THE INVENTION

However, the method described above has had problems in that the adhesiveness of the piezoelectric film on the substrate and the rate at which the film is formed vary greatly depending on the type of substrate. Therefore, improvements such as provision of an intermediate layer, e.g., a titanium film on the substrate have been proposed, but this has not necessarily been sufficient for improving the adhesiveness or the rate at which the film is formed.

The present invention has been contrived in view of such circumstances, and an object thereof is to provide a simple method for manufacturing a film such as a piezoelectric film whereby the adhesiveness of the film such as the piezoelectric film on the substrate can be improved.

As a result of earnest research intended to develop a simple method for manufacturing a film whereby the adhesiveness of a film on a substrate can be improved, the inventors have made the following findings.

In AD, particles of a film-forming material run against a substrate surface at a high speed, and these particles are crushed while being embedded into and adhering to the substrate. The inventors have discovered that with AD, the particles of film-forming material do not adhere to the substrate when there is a large difference between the hardness of the particles of the film-forming material and that of the substrate material, the reasons for which are believed to be as follows.

First, it is believed that the particles of film-forming material having run against the substrate surface are not crushed when the hardness of the particles of film-forming material is sufficiently high compared with the hardness of the substrate material. Then, it is believed that since the particles are not crushed and are embedded as large particles into the substrate surface, the adhesion surface area of the particles on the substrate is less than when crushed particles are embedded into the substrate, and the adhesion of the particles on the substrate is reduced.

Additionally, it is believed that it is difficult to form an electrically And chemically active new surface of the particle (where in general such a new surface can be exposed only by being crushed and electrical and chemical reactions are likely to occur at such a new surface, because of the absence of oxidation or contamination) as a result of the particles not being sufficiently crushed, and the adhesive strength of the particles on the substrate surface is reduced because this new surface electrically and chemically bonds with the substrate surface at a lower degree.

Also, when the substrate is composed of a brittle material, a phenomenon that the substrate is etched by the striking material particles can be easily observed. It can be surmised that the particles have not been crushed, if it is assumed that this phenomenon is based on the result of the facts that the particles are not crushed due to being sufficiently hard compared to the substrate, and that the energy expected to be consumed when the particles are crushed is used to damage the substrate surface.

However, it is also believed that when the hardness of the particles of film-forming material is sufficiently less than the hardness of the substrate material, the particles that collide with the substrate surface are repelled without becoming embedded into the substrate surface, and a sufficient anchor layer is not formed, making film formation difficult. In this case, it is believed that if the collision energy of the particles is increased, it is possible to embed the particles into the substrate surface due to the increased collision energy. However, it is believed that when the hardness of the particles is extremely low, the particles themselves are destroyed If the collision energy of the particles is increased, and they cannot be embedded into the substrate surface.

A new surface is also formed in the substrate surface, and this new surface is believed to act to increase the adhesive strength of the substrate with the particles. Specifically, it is believed that when the hardness ratio between the particles and the substrate is within an appropriate range, deformation, cracking, structural defects, dislocations, and straining occur not only in the particles but also in the substrate surface, the adhesion surface area increases, a new surface is formed, and the adhesive strength between the particles and the substrate increases.

Based on the findings and considerations given above, the inventors have discovered that it is extremely effective to consider the relative relationship between the hardness of the particles and the hardness of the substrate surface in order to control the film forming properties when forming a film by allowing particles to adhere to a substrate. Specifically, keeping the ratio between the hardness of the particles and the hardness of the surface substrate within a certain range makes it possible to embed the particles into the substrate in a crushed stats, or to form an electrically and chemically active new surface on the particles and the substrate surface. Alternatively, utilizing all these findings together makes it possible to improve the adhesiveness between the particles and the substrate. The present invention has been contrived based on these new findings.

Specifically, the present invention provides a method for manufacturing a film on a substrate by ejecting an aerosol containing particle onto the substrate so that the particles adhere thereto, wherein the ratio between the Vickers hardness $Hv(b)$ of the adhesion surface to which the particles are attached in the substrate, and the Vickers hardness $Hv(p)$ of the particles is within such a range that allows the particles to adhere to the adhesion surface.

Also, the present invention provides a method for manufacturing a film on a substrate by ejecting an aerosol containing particles onto a substrate so that the particles adhere thereto, wherein the ratio between the Vickers hardness $Hv(b)$ of the adhesion surface to which the particles are attached in the substrate, and the Vickers hardness $Hv(p)$ of the particles is within a range of $0.39 \leq Hv(p)/Hv(b) \leq 3.08$.

Also, the film manufacturing method of the present invention is preferably a method for manufacturing a piezoelectric film on a substrate by ejecting an aerosol containing particles of a piezoelectric material onto the substrate so that the particles adhere thereto, wherein the ratio between the Vickers hardness Hv(b) of the adhesion surface to which the particles are attached in the substrate, and the Vickers hardness Hv(p) or the particles is within a range of $0.39 \leq Hv(p)/Hv(b) \leq 3.08$.

Further, the film manufacturing method of the present invention is preferably a method for manufacturing a piezoelectric film on a substrate by ejecting an aerosol containing particle of a piezoelectric material onto the substrate so that the particles adhere thereto, wherein the ratio between the Vickers hardness Hv(b) of the adhesion surface to which the particles are attached in the substrate, and the Vickers hardness Hv(p) of the particles is within a range of $0.43 \leq Hv(p)f/v(b)<1.43$.

In the present invention, the combination of the particles and substrate that can be used should be a combination wherein the relationship between the hardness Hv(b) and the hardness Hv(p) is within the range given above. For example, lead zirconate titanate (PZT) or ferrite can be used for the particles, and a glass substrate (a glass substrate wherein a PZT film is formed on the surface, or a glass substrate wherein a ferrite film is formed on the surface) can be used as the substrate.

The Vickers hardness of the substrate and particles can be measured by nanoindentation, which allows the hardness of thin films and microdomains to be measured.

Moreover, for the particles and substrate that can be used in the present invention, the Vickers hardness Hv(p) of the particles is preferably not less than 300 and not more than 400, and the Vickers hardness Hv(b) of the substrate is preferably not less than 280 and not more than 700. PZT, for example, can be used for particles with this type of hardness. Ferritic stainless steel such as SUS 430 (prescribed by Japanese Industrial Standards), for example, can be used for the substrate.

Also, the present invention provides a method for manufacturing a film on a substrate by ejecting an aerosol containing particles onto the substrate so that the particles adhere thereto, wherein the ratio between the Vickers hardness Hv(b) of the adhesion surface to which the particles are attached in the substrate, and the compression breaking strength Gv(p) of the particles is within such a range that allows the particles to adhere to the adhesion surface.

Also, the present invention provides a method for manufacturing a film on a substrate by ejecting an aerosol containing particles onto the substrate so that the particles adhere thereto, wherein the ratio between the Vickers hardness Hv(b) of the adhesion surface to which the particles are attached in the substrate, and the compression breaking strength Gv(p) of the particles in unit of GPa is within a range of $0.10 \leq Gv(p)/Hv(b) \times 100 \leq 3.08$.

Also, the film manufacturing method of the present invention is preferably a method for manufacturing a piezoelectric film on a substrate by ejecting an aerosol containing particles of a piezoelectric material onto the substrate so that the particles to adhere thereto, wherein the ratio between the Vickers hardness Hv(p) of the adhesion surface to which the particles are attached in the substrate, and the compression breaking strength Gv(p) of the particles in unit of GPa is within a range of $0.10 \leq Gv(p)/Hv(b) \times 100 \leq 3.08$ Also, the film manufacturing method of the present invention is preferably a method for manufacturing a piezoelectric film on a substrate by ejecting a aerosol containing particles of a piezoelectric material onto the substrate so that the particles adhere thereto, wherein the ratio between the Vickers hardness Hv(b) of the adhesion surface to which the particles are attached in the substrate, and the compression breaking strength Gv(p) of the particles in unit of GPa is within a range of $0.11 \leq Gv(p)/Hv(b) \times 100 \leq 1.43$.

In the present invention, the combination of the particles and substrate that can be used should be a combination wherein the relationship between the hardness Hv(b) and the compression breaking strength Gv(p) is within the range given above. For example, lead zirconate titanate (PZT) or ferrite can be used for the particles, and a glass substrate (a glass substrate wherein a PZT film is formed on the surface, or a glass substrate wherein a ferrite film is formed on the surface) can be used as the substrate.

The compression breaking strength of the particles can be measured by nanoindentation. The compression breaking strength is defined as follows:

$$\text{Compression breaking strength} = \text{Tensile stress acting on the particle during compression breaking} = 0.9 \times Fd/d^2.$$

"Fd" is the compression force acting on the particle when the particle is broken, and "d" is the particle diameter in a direction orthogonal to the compression force when the particle is broken. Specifically, the particle diameter is the diameter of a circle having the same surface area as a projected cross-sectional area of the particle when a compression force is applied vertically to the particle, the particle is observed from above, and the particle is broken.

Also, for the particles and substrate that can be used in the present invention, the compression breaking strength Gv(p) of the particles is preferably not less than 0.8 GPa and not more than 4.0 GPa, and the Vickers hardness Hv(b) of the substrate is preferably not less than 280 and not more than 700. PZT, for example, can be used for particles with this type of compression breaking strength. Ferritic stainless steel such as SUS 430(prescribed by Japanese Industrial Standards), for example, can be used for the substrate.

According to the present invention, in the method for manufacturing a film on a substrate by ejecting an aerosol containing particles onto the substrate so that the particles adhere thereto, the ratio between the Vickers hardness Hv(b) of the adhesion surface to which the particles are attached in the substrate, and the Vickers hardness Hv(p) of the particles is made within a range of $0.39 \leq Hv(p)/Hv(b) \leq 3.08$, whereby adhesiveness of the particles to the substrate can be ensured.

Also, according to the present invention, in the method for manufacturing a piezoelectric film on a substrate by ejecting an aerosol containing particles of a piezoelectric material onto the substrate so that the particles adhere thereto, the ratio between the Vickers hardness Hv(b) of the adhesion surface to which the particles are attached in the substrate, and the Vickers hardness Hv(p) of the particles is made within a range of $0.39 \leq Hv(p)/Hv(b) \leq 3.08$, whereby adhesiveness of the particles to the substrate can be ensured and a piezoelectric film can be reliably manufactured.

Further, according to the present invention, in the method for manufacturing a piezoelectric film on a substrate by ejecting an aerosol containing particles of a piezoelectric material onto the substrate so that the particles adhere thereto, the ratio between the Vickers hardness Hv(b) of the adhesion surface to which the particles are attached in the substrate, and the Vickers hardness Hv(p) of the particles is made within a range of $0.43 \leq Hv(p)/Hv(b) \leq 1.43$, whereby the adhesiveness of the particles to the substrate can be further improved and a cost-effective method for manufacturing a piezoelectric film can be designed.

According to the present invention, in the method for manufacturing a film on a substrate by ejecting an aerosol containing particles onto the substrate so that the particles adhere thereto, the ratio between the Vickers hardness Hv(b) of the adhesion surface to which the particles are attached in the substrate, and the compression breaking strength Gv(p) of the particles in unit of GPa is made within such a range that allows the particles to adhere to the adhesion surface, specifically, a range of $0.10 \leqq Gv(p)/Hv(b) \times 100 \leqq 3.08$, whereby adhesiveness of the particles to the substrate can be ensured.

Also, according to the present invention, in the method for manufacturing a piezoelectric film on a substrate by ejecting an aerosol containing particles of a piezoelectric material onto the substrate so that the particles adhere thereto, the ratio between the Vickers hardness Hv(b) of the adhesion surface to which the particles are attached in the substrate, and the compression breaking strength Gv(p) of the particles in unit of GPa is made within a range of $0.10 \leqq Gv(p)/Hv(b) \times 100 \leqq 3.08$, whereby adhesiveness of the particles to the substrate can be ensured and a piezoelectric film can be reliably manufactured.

Further, according to the present invention, in the method for manufacturing a piezoelectric film on a substrate by ejecting an aerosol containing particles of a piezoelectric material onto the substrate so that the particles adhere thereto, the ratio between the Vickers hardness Hv(b) of the adhesion surface to which the particles are attached in the substrate, and the compression breaking strength Gv(p) of the particles in unit of GPa is made within a range of $0.11 \leqq Gv(p)/Hv(b) \times 100 \leqq 1.43$, whereby the adhesiveness of the particles to the substrate can be further improved and a cost-effective method for manufacturing a piezoelectric film can be designed.

DETAILED DESCRIPTION OF THE INVENTION

Figure 1:
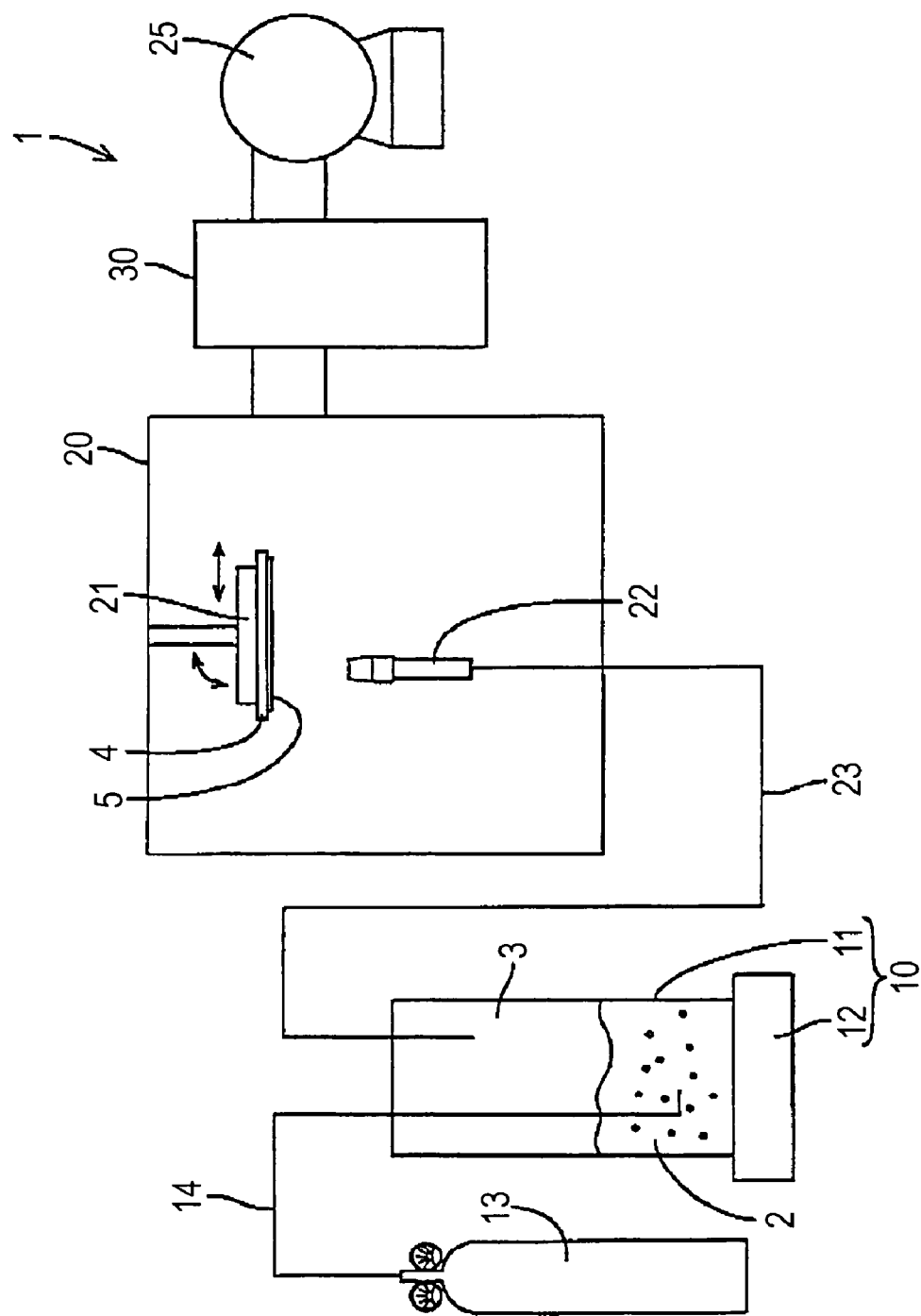
FIG. 1 is a schematic view of the film forming apparatus of the present invention.

A schematic view of the film forming apparatus for forming a film such as a piezoelectric film of the present invention is shown in FIG. 1. This film forming apparatus 1 includes an aerosol generator 10 that disperses material particles 2 in a carrier gas to form an aerosol 3, a film-forming chamber 20 for ejecting the aerosol 3 through a nozzle and allowing the aerosol to adhere to a substrate, and a powder recovery apparatus 30 for recovering the material particles 2 from the aerosol 3 after use.

The aerosol generator 10 includes an aerosol chamber 11 capable of storing particles 2 of a film-forming material in the interior, and a vibration apparatus 12 that is mounted on the aerosol chamber 11 and that causes the aerosol chamber 11 to oscillate. A gas cylinder 13 for introducing a carrier gas is connected to tap aerosol chamber 11 via an inlet tube 14. The end of the inlet tube 14 is positioned near the bottom of the interior of the aerosol chamber 11, and is lowered in the material particles 2. Examples of the carrier gas include inert gas such as helium, argon and nitrogen, and the other gas such as air and oxygen. The film-forming material is not particularly limited. Also, when a piezoelectric film is formed as the film, a material normally used for piezoelectric films, for example, lead titanate zirconate (PZT), quartz, lithium niobate, barium titanate, lead titanate, lead metaniobate, zinc oxide, or the like can be used.

The film-forming chamber 20 includes a stage 21 for mounting a substrate 4, and a ejection nozzle 22 provided underneath the stage 21. The ejection nozzle 22 is connected to the aerosol chamber 11 via an aerosol feed tube 23, and the aerosol 3 in the aerosol chamber 11 is fed to the ejection nozzle 22 through the aerosol feed tube 23. Also, the stage 21 is capable of moving in the direction of the plate surface when the substrate 4 is mounted by means of a drive apparatus not shown in the diagram, and the angle of the substrate surface can be adjusted in relation to the direction that the aerosol is ejected from the ejection nozzle 22 (refer to the arrow in FIG. 1). Also, a vacuum pump 25 is connected to the film-forming chamber 20 via the powder recovery apparatus 30, and can reduce the pressure in the interior thereof.

When a film is formed using this film forming apparatus 1, the material particles 2 are led into the interior of the aerosol chamber 11. Then, the carrier gas is introduced from the gas cylinder 13 thereto, and the material particles 2 are raised up by the gas pressure. At the same time, the aerosol chamber 11 is caused to oscillate by the vibration apparatus 12, whereby the material particles 2 and the carrier gas are mixed to produce the aerosol 3. Then, as a result of the pressure in the film-forming chamber 20 being reduced by the vacuum pump 25, the aerosol 3 is ejected from the ejection nozzle 22 at an increasing speed due to the pressure difference between the aerosol chamber 11 and the film-forming chamber 20. The material particles 2 contained in the ejected aerosol 3 collide with and are deposited onto the substrate 4, forming a film 5. The aerosol is ejected while the substrate 4 is moved in the plate surface direction by the drive apparatus which is put in for the stage 21, whereby the film 5 is formed over the entire surface of the substrate 4.

The film 5 can be formed on the substrate 4 if a substrate and material particles are selected such that the ratio of the Vickers hardness Hv(b) of the substrate 4 and the Vickers hardness Hv(p) of the particles 2 satisfies the relationship $0.39 \leqq Hv(p)/Hv(b) \leqq 3.08$ in the preferred ranges of the film forming conditions. These conditions are, for example, an internal pressure of 50 to 400 Pa in the film-forming chamber, an internal pressure of 10,000 to 80,000 Pa in the aerosol chamber, a nozzle opening size of 10 mm×0.4 mm, He or air as the type of carrier gas, a nozzle-substrate relative speed of 1.2 mm/sec, a nozzle-to-substrate distance of 10 to 20 mm, an average material particle diameter of 0.3 to 1 μm and a particle speed of 150 to 400 m/sec.

Particularly, when particles 2 of a piezoelectric material (PZT) are ejected onto the substrate 4 to form a piezoelectric film 5, the ratio or the Vickers hardness Hv(b) of the substrate 4 and the Vickers hardness Hv(p) of the particles 2 is within a range of $0.43 \leqq Hv(p)/Hv(b) \leqq 1.43$. One possible example of such a combination of particles 2 and a substrate 4 is PZT particles with a Vickers hardness Hv(p) of 300 to 400, and a substrate made of SUS 430(Japanese Industrial Standards) with a hardness Hv(b) of 280 to 700.

The film 5 can also be formed on the substrate 4 if a substrate and material particles are selected such that the ratio of the Vickers hardness Hv(b) of the substrate 4 and the compression breaking strength Gv(p) of the particles 2 in unit of GPa satisfies the relationship $0.10 \leqq Gv(p)/Hv(b) \times 100 \leqq 3.08$ in the ranges of other preferred film forming conditions. These conditions are, for example, an internal pressure of 50 to 400 Pa in tap film-forming chamber, an internal pressure of 10,000 to 80,000 Pa in the aerosol chamber, a nozzle opening size of 10 mm×0.4 mm, He or air as the type of carrier gas, a nozzle-substrate relative speed of 1.2 mm/sec, a nozzle-to-substrate distance of 10 to 20 mm, an average material particle diameter of 0.3 to 1 μm, and a particle speed of 150 to 400 m/sec.

Particularly, when particles 2 of a piezoelectric material (PZT) are ejected onto the substrate 4 to form a piezoelectric film 5, the ratio of the Vickers hardness Hv(b) of the substrate 4 and the compression breaking strength Gv(p) of thee particles 2 in unit of GPa is within a range of $0.11 \leqq Gv(p)/Hv(h) \times 100 \leqq 1.43$. One possible example of such a combination of particles 2 and a substrate 4 is PZT particles with a compression breaking strength Gv(p) of 0.8 to 4.0 GPa, and a substrate made of SUS 430(Japanese Industrial Standards) with a hardness Hv(b) of 280 to 700.

EXAMPLES

The present invention will be described in more detail by reference of the following Examples.

[Determining the Relationship Between the Quality of Film Formation and the Hardness of the Substrate and Material Particles]

First, Examples 1a, 1b1 1c and 1d relate to film formation and will be described in which particulate PZT and particulate ferrite were ejected onto a glass substrate.

Example 1a

For the substrate, a glass substrate was used wherein the adhesion surface ejected with the aerosol had a Vickers hardness of Hv 644. The adhesion surface was polished so that the ten-point average roughness (i.e., the average roughness of ten points selected optionally on the substrate) was Rz≦0.7 (Rz refers to ten-point average roughness prescribed by Japanese Industrial Standards). Also, PZT with an average particle diameter of 0.3 to 1 μm and a Vickers hardness of Hv 300 to 400 was used as the particulate film-forming material.

The Vickers hardness was measured according to nanoindentation using a Nano-Hardness Tester available from +CSM instruments as the measuring device where the Tester uses a Berkovitch indenter au the indenting device and a test force F is 0.008 N.

A piezoelectric film (PZT film) with a thickness of 10 μm was formed on a glass substrate by the same film forming apparatus as in the Example described above. The film forming conditions ware an internal pressure of 150 Pa in the film-forming chamber, an internal pressure of 30,000 Pa in the aerosol chamber, a nozzle opening size of 10 mm×0.4 mm, He as the type of carrier gas, a nozzle-substrate relative speed of 1.2 mm/sec, a nozzle-to-substrate distance of 10 to 20 mm, and a particle speed of 250 m/sec. The outcome of the film formation was confirmed by the visual observation.

Example 1b

For the substrate, a glass substrate was used wherein the adhesion surface ejected with the aerosol had a Vickers hardness of Hv 644. The adhesion surface was polished so that the ten-point average roughness was Rz≦0.7 (Rz refers to ten-point average roughness prescribed by Japanese Industrial Standards). Also, ferrite with an average particle diameter of 0.3 to 1 μm and a Vickers hardness of Hv 960 to 1120 was used as the particulate film-forming material. Otherwise, a film was formed in the same manner as in Example 1a, and the outcome of the film formation was confirmed with the visual observation.

Example 1c

For the substrate, a glass substrate was used wherein a ferrite film with a thickness of 3 to 5 μm was formed on the substrate surface ejected with the aerosol. The surface of the ferrite film was polished so that the arithmetic average roughness was Ra≦0.8 (Ra refers to arithmetic average roughness prescribed by Japanese Industrial Standards) and the ten-point average roughness was Rz≦0.7 (Rz refers to ten-point average roughness prescribed by Japanese Industrial Standards). The Vickers hardness of this ferrite film surface (adhesion surface) was Hz 985. Also, PZT with an average particle diameter of 0.3 to 1 μm and a Vickers hardness of Hv 300 to 400 was used as the particulate film-forming material. Otherwise, a film was formed in the same manner as in Example 1a, and the outcome of the film formation was confirmed with the visual observation.

Example 1d

For the substrate, a glass substrate was used wherein a PZT film with a thickness of 3 to 5 μm was formed on the substrate surface ejected with the aerosol. The surface of the PZT film was polished so that the ten-point average roughness was Rz≦0.7 (Rz refers to ten-point average roughness prescribed by Japanese Industrial Standards). The Vickers hardness of this PZT film surface (adhesion surface) was Hz 611. Also, ferrite with an average particle diameter of 0.3 to 1 μm and a Vickers hardness of Hv 960 to 1120 was used as the particulate film-forming material, and a ferrite film was formed on the PZT film. Otherwise, a film was formed in the same manner as in example 1a, and the outcome of the film formation was observed with the visual observation.

<Results and Discussion>

The relationship between the type of substrate and material particles and the outcome of film formation is shown in Table 1.

TABLE 1

| | SUBSTRATE | | |
|---|---|---|---|
| PARTICLES | GLASS SUBSTRATE | PZT FILM ON GLASS SUBSTRATE | FERRITE FILM ON CLASS SUBSTRATE |
| PZT | Good | — | Good |
| FERRITE | Good | No good | — |

As shown in Table 1, ejected particles were confirmed to have formed into a film when an aerosol containing PZT particles (Vickers hardness Hv 300 to Hv 400) is ejected onto a glass substrate (Vickers hardness Hv 644), an aerosol containing ferrite particles (Vickers hardness Hv 960 to Hv 1120) is ejected onto a glass substrate (Vickers hardness Hv 644), and an aerosol containing PZT particles (Vickers hardness Hv 300 to Hv 400) is ejected onto a ferrite film (Vickers hardness Hv 985) on a glass substrate. Specifically, it was confirmed by visual observation that the film-forming material formed a film that completely covered the substrate without exposing the substrate. The ratio Hv(p)/Hv(b) in these cases was 0.47 to 0.62, 1.49 to 1.74, and 0.30 to 0.41, respectively.

Meanwhile, when an aerosol containing ferrite particles (Vickers hardness Hv 960 to 1120) was ejected onto a PZT film (Vickers hardness as 611) on a glass substrate, it was confirmed by the visual observation that a ferrite film was formed on the PZT film. However, partial peeling also sometimes occurred. The ratio Hv(p)/Hv(b) in these cases was 1.57 to 1.83.

A comparison of Example 1c and Example 1d shows that only the material constituting the substrate and the material of the ejected particles were exchanged, and the other conditions were all the same. Taking into consideration that there was no difference in the effects of diffusion or chemical reaction in the two stacked material layers, the different condition to be considered in these two examples is only the relationship between the hardness of the substrate and the hardness of the ejected particles. Therefore, this difference is believed to have an influence on the outcome of film formation. Specifically, it is believed that since the hardness of the particles in relation to the hardness of the substrate is greater in Example 1d than in Example 1c, and the ratio of particles that are crushed when being ejected on the substrate is lower, then less energy is consumed by crushing, a larger amount of energy is accumulated in the resulting film, and this energy increases the internal stress in the film, making the film susceptible to peeling.

It is clear from the above that the film forming properties depend on the ratio between the Vickers hardness Hv(b) of the adhesion surface of the substrate to which the particles adhere and the Vickers hardness Hv(p) of the particles. Particularly, it was clear that a ratio of $0.30 \leq Hv(p)/Hv(b) \leq 1.57$ is preferred because a film is formed wherein peeling is not likely to occur.

[Determining the Relationship between the Hardness of the Substrate and the Film Formation Rate]

Next, Examples 2a, 2b, 2c, 2d, 2e, 2f and 2g will be described in which PZT particles were ejected onto a substrate composed of ferritic stainless steel (SUS430 prescribed by Japanese Industrial Standards) and onto a Pt film formed on the substrate surface to form a piezoelectric film.

Example 2a

A ferritic stainless steel (SUS430 prescribed by Japanese Industrial Standards) plate with a Vickers hardness of Hv 210 at the substrate surface (adhesion surface) onto which an aerosol was ejected was used as the substrate. The substrate surface was polished so that the ten-point average roughness was $Rz \leq 0.7$ (Rz refers to ten-point average roughness prescribed by Japanese Industrial Standards). Also, PZT with an average particle diameter of 0.3 to 1 µm and a Vickers hardness of Hv 300 to 400 was used as the material particles.

The surface hardness of the stainless steel substrate was adjusted by heating the substrate at 400 to 800° C. in air or in a vacuum and varying the surface characteristics. The Vickers hardness was measured by nanoindentation using a Nano-Hardness Tester available from +CSM instruments as the measuring device where the Tester uses a Berkovitch indenter as the indenting device and a test force F is 0.015 N.

A piezoelectric film with a thickness of 10 µm was formed on a substrate by the same film forming apparatus as in Examples described above. The film forming conditions were an internal pressure of 150 Pa in the film-forming chamber, an internal pressure of 30,000 Pa in the aerosol chamber, a nozzle opening size of 10 mm×0.4 µm, He as the type of carrier gas, a nozzle-substrate relative speed of 1.2 mm/sec, a nozzle-to-substrate distance of 10 to 20 mm, and a particle speed or 250 m/sec. The rate at which the piezoelectric film was formed was measured.

Example 2b

For the substrate, a ferritic stainless steel (SUS430 prescribed by Japanese Industrial Standards) plate was used wherein the substrate surface ejected with the aerosol had a Vickers hardness of Hv 280, otherwise a film was formed in the same manner as in Example 2a, and the film formation rate was measured.

Example 2c

For the substrate, a ferritic stainless steel (SUS430 prescribed by Japanese Industrial Standards) plate with a Vickers hardness of Hv 290 was used, otherwise a film was formed in the same manner as in Example 2a, and the film formation rate was measured.

Example 2d

For the substrate, a ferritic stainless steel (SUS430 prescribed by Japanese Industrial Standards) plate with a Vickers hardness of Hv 440 was used, otherwise a film was formed in the same manner as in example 2a , and the film formation rate was measured.

Example 2e

For the substrate, a Pt film was formed in advance by sputtering on the surface (the surface onto which the aerosol was ejected) of a ferritic stainless steel (SUS430 prescribed by Japanese Industrial Standards) plate, and the Vickers Hardness of the surface was adjusted to Hv 700, otherwise the film was formed in the same manner as in Example 2a, and the film formation rate was measured.

Example 2f

For the substrate, a gold-plated plate with a Vickers hardness of Hv 130 was used, otherwise a film was formed in the same manner as in Example 2a, and the film formation rate was measured.

Example 2g

For the substrate, the surface (the surface onto which the aerosol was ejected) of a ceramic plate was coated in advance with Pt in the form of a paste and sintered at 850 to 1200° C. to adjust the Vickers hardness of the surface to Hv 770, otherwise a film was formed in the same manner as in Example 2a, and the film formation rate was measured.

<Results and Discussion>

Table 2 shows the data for the substrate material, Vickers hardness, and film formation rate.

TABLE 2

| SUBSTRATE MATERIAL | SUBSTRATE HARDNESS (Hv) | Hv(p)/Hv(b) | FILM FORMATION RATE (µm/s) |
|---|---|---|---|
| Au | 130 | 2.31-3.08 | 1.30E-01 |
| SUS430 | 210 | 1.43-1.90 | 1.40E-01 |
| SUS430 | 280 | 1.07-1.43 | 2.20E-01 |
| SUS430 | 290 | 1.03-1.38 | 2.90E-01 |
| SUS430 | 440 | 0.68-0.91 | 2.70E-01 |
| Pt/SUS430 | 700 | 0.43-0.57 | 2.10E-01 |
| Pt/CERAMICS | 770 | 0.39-0.52 | 1.50E-01 |

As shown in Table 2, a substrate hardness of Hv 130 resulted in a low film formation rate of 0.13 µm/sec. Increasing the substrate hardness gradually increases the film formation rate, which shows a sudden increase particularly near a hardness of Hv 280, and reach into maximum at 0.29 µm/sec at a hardness of Hv 290. This is believed to be because the microparticles firmly adhere to the substrate or to the already adhered other particles as a result of an increase in the proportion in which the microparticles colliding with the substrate surface are crushed.

Further increasing the hardness of the substrate gradually reduces the film formation rate, and the film formation rate greatly decreases near a hardness of Hv 700. This is believed to be because the microparticles are repelled by the substrate surface and are less likely to be embedded therein. The film formation rate was satisfactory for practical purposes at a substrate hardness of up to Hv 700, and it was confirmed by the visual observation that a piezoelectric film with a satisfactory adhesiveness completely covered the substrate surface. Further increasing the hardness resulted in a further decrease in film formation rate.

It was confirmed from the above that film growth could be reliably achieved by keeping the Vickers hardness Hv(b) of the substrate in a range of 130 to 770, or, specifically, by keeping the ratio of the Vickers hardness Hv(b) of the adhesion surface to which the particles are attached in the substrate, and the Vickers hardness Hv(p) of the microparticles within a range of $0.39 \leq Hv(p)/Hv(b) \leq 3.08$. It was clear that a piezoelectric film with sufficient adhesiveness was reliably formed in a short amount of time with satisfactory results particularly by keeping the Vickers hardness Hv(b) of the substrate in a range of 280 to 700, or, specifically, by keeping the ratio of the Vickers hardness Hv(b) of the adhesion surface to which the particles are attached in the substrate, and the Vickers hardness Hv(p) of the microparticles within a range of $0.43 \leq Hv(p)/Hv(b) \leq 1.43$. Furthermore, it was clear that keeping the Vickers hardness Hv(b) of the substrate in a range of 290 to 440, or, specifically, keeping the aforementioned ratio in a range of $0.68 \leq Hv(p)/Hv(b) \leq 1.38$, makes it possible to achieve a method for manufacturing a piezoelectric film that is superior in terms of productivity and manufacturing costs (microparticle material costs) and can be consistently formed at a high rate.

[Determining the Effects of Aerosol Ejecting Speed on Film Formation Outcome]

Next, the outcome of film formation when the aerosol ejecting speed is varied was tested.

Example 3

The substrate and material particles were the same as in Example 2a, and the particle speed of the material particles was varied within a range of 150 m/s to 400 m/s. The other film forming conditions were the same as in Example 2a.

<Results and Discussion>

The data pertaining to the outcome of film formation when the particle speed is varied is shown in Table 3. A film formation rate of 0.1 µm/s or greater is denoted by "G" (being Good), and less than 0.1 µm/s by "NG" (being No Good). The symbol "—" denotes combinations of particle speed and hardness ratio that were not measured.

range of 200 m/s to 400 m/s. However, when the ratio of Hv(b) and Hv(p) was in a range of 0.25 to 3.0, film formation was confirmed even when the aerosol particle speed was set to any number within a range of 150 m/s to 400 m/s (except fox combinations or hardness ratio and particle speed in which film formation rate was not measured). From these results, it is believed that the aerosol particle speed has a small influence on the outcome of film formation.

[Determining the Relationship between the Hardness of the Substrate and Compression Breaking Strength of the Particles, and the Film Formation Rate]

In the AD technique, since the particles are crushed and adheres to the substrate by the energy of the particles striking the substrate, the film formation rate is affected by both the ratio between the hardness of the substrate and the material particles, and the ratio between the hardness of the substrate and the compression breaking strength of the material particles.

Examples 4a, 4b, 4c and 4d will now be described in more detail in which PZT particles were ejected onto a substrate composed of ferritic stainless steel (SUS430 prescribed by Japanese Industrial Standards) and onto a Pt film formed on the substrate surface to form a piezoelectric film.

Example 4a

A ferritic stainless steel (SUS430 prescribed by Japanese Industrial Standards) plate with a Vickers hardness of Hv 210 at the substrate surface (adhesion surface) onto which an aerosol was ejected was used as the substrate. The substrate surface was polished so that the ten-point average roughness was $Rz \leq 0.7$ (Rz refers to ten-point average roughness prescribed by Japanese Industrial Standards). Also, PZT with an average particle diameter of 0.3 to 1 µm and a compression breaking strength of 0.8 to 4.0 GPa was used as the material particles.

The surface hardness of the stainless steel substrate was adjusted by heating the substrate at 400 to 800° C. in air or in a vacuum and varying the surface characteristics. The Vickers hardness was measured by nanoindentation using a Nano-Hardness Tester available from +CSM instruments as the measuring device where a Berkovitch indenter is used as the indenting device, and a test force F is 0.015 N. The Nano-Hardness Tester was also used to measure the compression breaking strength.

A piezoelectric film with a thickness of 10 µm was formed on a substrate by the same film forming apparatus as in the

TABLE 3

| PARTICLE SPEED (m/s) | HARDNESS RATIO | | | | | | |
|---|---|---|---|---|---|---|---|
| | 0 OR GREATER-LESS THAN 0.25 | 0.25-0.5 | 0.5-1.0 | 1.0-1.5 | 1.5-2.0 | 2.0-2.5 | 2.5-3.0 |
| 350-400 | NG | G | G | G | G | G | G |
| 300-350 | NG | G | G | G | G | G | G |
| 250-300 | NG | G | G | G | G | G | G |
| 200-250 | NG | G | G | G | G | G | G |
| 150 OR GREATER-LESS THAN 200 | — | — | G | — | — | — | — |

As shown in Table 3, no film was formed when the ratio of the Vickers hardness Hv(b) of the adhesion surface to which the particles are attached in the substrate, and the Vickers hardness Hv(p) of the microparticles was within a range of 0 to 0.25, even it the aerosol particle speed was varied within a Examples described above. The film forming conditions were an internal pressure of 150 Pa in the film-forming chamber, an internal pressure of 30,000 Pa in the aerosol chamber, a nozzle opening size of 10 mm×0.4 mm, He as the type of carrier gas, a nozzle-substrate relative speed of 1.2 mm/sec, a nozzle-to-substrate distance of 10 to 20 mm, and a particle speed of 250 m/sec. The rate at which the piezoelectric film was formed was measured.

Example 4b

For the substrate, a ferritic stainless steel (SUS430 prescribed by Japanese Industrial Standards) plate was used wherein the substrate surface elected with the aerosol had a Vickers hardness of Hv 280, otherwise a film was formed in the same manner as in Example 4a, and the film formation rate was measured.

Example 4c

For the substrate, a ferritic stainless steel (SUS430 prescribed by Japanese Industrial Standards) plate with a Vickers hardness of Hv 290 was used, otherwise a film was formed in the same manner as in Example 4a, and the film formation rate was measured.

Example 4d

For the substrate, a ferritic stainless steel (SUS430 prescribed by Japanese Industrial Standards) plate with a Vickers hardness of Hv 440 was used, otherwise a film was formed in the same manner as in Example 4a, and the film formation rate was measured.

Example 4e

For the substrate, a Pt film was formed in advance by sputtering on the surface (the surface onto which the aerosol was ejected) of a ferritic stainless steel (SUS430 prescribed by Japanese Industrial Standards) plate, and the Vickers Hardness of the surface was adjusted to Hv 700, otherwise the film was formed in the same manner as in Example 4a, and the film formation rate was measured.

Example 4f

For the substrate, a gold-plated plate with a Vickers hardness of Hv 130 was used, otherwise a film was formed in the same manner as in Example 4a, and the film formation rate was measured.

Example 4g

For the substrate, the surface (the surface onto which the aerosol was ejected) of a ceramic plate was coated in advance with Pt in the form of a paste and sintered at 850 to 1200° C. to adjust the Vickers hardness of the surface to Hv 770, otherwise a film was formed in the same manner as in Example 4a, and the film formation rate was measured.

<Results and Discussion>

Table 4 shows the data for the substrate material, the Vickers hardness Hv(b) of the substrate, the ratio between the Vickers hardness Hv(b) of the substrate and the compression breaking strength Gv(p)/Gpa of the material particles, and the film formation rate.

TABLE 4

| SUBSTRATE MATERIAL | SUBSTRATE HARDNESS (Hv) | Gv(p)/Hv(b) × 100 | FILM FORMATION RATE (μm/s) |
|---|---|---|---|
| Au | 130 | 0.62-3.08 | 1.30E-01 |
| SUS430 | 210 | 0.38-1.90 | 1.40E-01 |
| SUS430 | 280 | 0.29-1.43 | 2.20E-01 |
| SUS430 | 290 | 0.28-1.38 | 2.90E-01 |
| SUS430 | 440 | 0.18-0.91 | 2.70E-01 |
| Pt/SUS430 | 700 | 0.11-0.57 | 2.10E-01 |
| Pt/CERAMICS | 770 | 0.10-0.52 | 1.50E-01 |

As shown in Table 4, a substrate hardness of Hv 130 resulted in a low film formation rate of 0.13 μm/sec. Increasing the substrate hardness gradually increases the film formation rate, which shows a sudden increase particularly near a hardness of Hv 280, and reaches its maximum at 0.29 μm/sec at a hardness of Hv 290. This is believed to be because the microparticles firmly adhere to the substrate or to the already adhered other particles as a result of an increase in the proportion in which the microparticles colliding with the substrate surface are crushed.

Further increasing the hardness of the substrate gradually reduces the film formation rate, and the film formation rate greatly decreases near a hardness of Hv 700. This is believed to be because the microparticles are repelled by the substrate surface and are less likely to be embedded therein. The film formation rate was satisfactory for practical purposes at a substrate hardness of up to Hv 700, and it was confirmed by the visual observation that a piezoelectric film with a satisfactory adhesiveness completely covered the substrate surface. Further increasing the hardness resulted in a further decrease in the film formation rate.

It was confirmed from the above that film growth could be reliably achieved by keeping the Vickers hardness Hv(b) of the substrate in a range of 130 to 770, or, specifically, by keeping the ratio of the Vickers hardness Hv(b) of the adhesion surface to which the particles are attached in the substrate, and the compression breaking strength Gv(p) of the microparticles in unit of GPa within a range of $0.10 \leq Gv(p)/Hv(b) \times 100 \leq 3.08$. It was clear that a piezoelectric film with sufficient adhesiveness was reliably formed in a short amount of time with satisfactory results, particularly by keeping the Vickers hardness Hv(b) of the substrate in a range of 280 to 700, or, specifically, by keeping the ratio of the Vickers hardness Hv(b) of the adhesion surface to which the particles are attached in the substrate, and the compression breaking strength Gv(p) of the microparticles in unit of GPa within a range of $0.11 \leq Gv(p)/Hv(b) \times 100 \leq 1.43$. Furthermore, it was clear that keeping the Vickers hardness Hv(b) of the substrate in a range of 290 to 440, or, specifically, keeping the aforementioned ratio in a range of $0.18 \leq Gv(p)/Hv(h) \times 100 \leq 1.38$, makes it possible to achieve a method for manufacturing a piezoelectric film that is superior in terms of productivity and manufacturing costs (microparticulate material costs) and can be consistently formed at a high rate.

In the piezoelectric film manufactured as described in Examples above, particles of piezoelectric material adhere to the surface of the substrate in a state in which the particles are embedded into the substrate while being crushed. In such a state, the particle boundaries are believed to be longer than when particles adhere to the substrate without being crushed. Therefore, when the piezoelectric film thus manufactured is used as a piezoelectric actuator, the actuator can be provided with superior dielectric strength characteristics.

The entire disclosure of the specification, claims, summary and drawing of Japanese Patent Application No. 2004-100282 filed on Mar. 30, 2004 is hereby incorporated by reference.

What is claimed is:

1. A method for manufacturing a film on a substrate by ejecting an aerosol containing particles onto the substrate so that the particles adhere thereto;
wherein the ratio between the Vickers hardness Hv(b) of the adhesion surface to which the particles are attached in the substrate, and the Vickers hardness Hv(p) of the particles is within a range of $0.39 \leq Hv(p)/Hv(b) \leq 3.08$.

2. The method for manufacturing a film according to claim 1, wherein the method is a method for manufacturing a piezoelectric film on the substrate by ejecting an aerosol containing particles of a piezoelectric material onto the substrate so that the particles adhere thereto.

3. The method for manufacturing a film according to claim 1, wherein the method is a method for manufacturing a piezoelectric film on the substrate by ejecting an aerosol containing particles of a piezoelectric material onto the substrate so that the particles adhere thereto; and
wherein the ratio between the Vickers hardness Hv(b) of the adhesion surface to which the particles are attached in the substrate, and the Vickers hardness Hv(p) of the particles is within a range of $0.43 \leq Hv(p)/Hv(b) \leq 1.43$.

4. The method for manufacturing a piezoelectric film according to claim 2, wherein the Vickers hardness Hv(p) of the particles is not less than 300 and not more than 400, and the Vickers hardness Hv(b) of the substrate is not less than 280 and not more than 700.

5. The method for manufacturing a piezoelectric film according to claim 3, wherein the Vickers hardness Hv(p) of the particles is not less than 300 and not more than 400, and the Vickers hardness Hv(b) of the substrate is not less than 280 and not more than 700.

6. A method for manufacturing a film on a substrate by ejecting an aerosol containing particles onto the substrate so that the particles adhere thereto;
wherein the ratio between the Vickers hardness Hv(b) of the adhesion surface to which the particles are attached in the substrate, and the compression breaking strength Gv(p) of the particles, in units of Gpa, is within a range of $0.10 \leq Gv(p)/Hv(b) \times 100 \leq 3.08$.

7. The method for manufacturing a film according to claim 6, wherein the method is a method for manufacturing a piezoelectric film on the substrate by ejecting an aerosol containing particles of a piezoelectric material onto the substrate so that the particles adhere thereto.

8. The method for manufacturing a film according to claim 6, wherein the method is a method for manufacturing a piezoelectric film on the substrate by ejecting an aerosol containing particles of a piezoelectric material onto the substrate so that the particles adhere thereto; and
wherein the ratio between the Vickers hardness Hv(b) of the adhesion surface to which the particles are attached in the substrate, and the compression breaking strength Gv(p) of the particles in unit of GPa is within a range of $0.11 \leq Gv(p)/Hv(b) \times 100 \leq 1.43$.

9. The method for manufacturing a piezoelectric film according to claim 7, wherein the compression breaking strength Gv(p) of the particles is not less than 0.8 GPa and not more than 4.0 GPa, and the Vickers hardness Hv(b) of the substrate is not less than 280 and not more than 700.

10. The method for manufacturing a piezoelectric film according to claim 8, wherein the compression breaking strength Gv(p) of the particles is not less than 0.8 GPa and not more than 4.0 GPa, and the Vickers hardness Hv(b) of the substrate is not less than 280 and not more than 700.

* * * * *